US010507650B1

(12) United States Patent
Knierim

(10) Patent No.: US 10,507,650 B1
(45) Date of Patent: Dec. 17, 2019

(54) PIEZOELECTRIC PRINT HEAD DRIVE WITH ENERGY RECOVERY

(71) Applicant: XEROX CORPORATION, Norwalk, CT (US)

(72) Inventor: David L. Knierim, Wilsonville, OR (US)

(73) Assignee: XEROX CORPORATION, Norwalk, CT (US)

(*) Notice: Subject to any disclaimer, the term of this patent is extended or adjusted under 35 U.S.C. 154(b) by 0 days.

(21) Appl. No.: 16/040,949

(22) Filed: Jul. 20, 2018

(51) Int. Cl.
  *B41J 2/045* (2006.01)
  *B41J 2/14* (2006.01)
  *H01L 41/09* (2006.01)
  *H01L 41/187* (2006.01)
  *H01L 41/04* (2006.01)

(52) U.S. Cl.
  CPC ....... *B41J 2/04548* (2013.01); *B41J 2/04581* (2013.01); *B41J 2/14201* (2013.01); *B41J 2002/14491* (2013.01); *H01L 41/042* (2013.01); *H01L 41/0973* (2013.01); *H01L 41/1876* (2013.01)

(58) Field of Classification Search
  CPC ................ B41J 2/04548; B41J 2/04581; B41J 2/14201; B41J 2002/14491; H01L 41/042; H01L 41/1876; H01L 41/0973
  USPC ......................................................... 347/10
  See application file for complete search history.

(56) References Cited

U.S. PATENT DOCUMENTS

2015/0015627 A1* 1/2015 Cleare ............... B41J 2/04541
  347/9

* cited by examiner

Primary Examiner — Stephen D Meier
Assistant Examiner — Alexander D Shenderov
(74) Attorney, Agent, or Firm — Miller Nash Graham and Dunn

(57) ABSTRACT

An energy recovery circuit in a print head includes at least one waveform rail, an array of piezoelectric actuators selectively electrically connectable to the waveform rail, the piezoelectric actuators creating a capacitive load, at least one pseudo jet capacitive load, selectively coupled to the waveform rail, depending upon how many piezoelectric actuators are connected to the waveform rail, and a first inductor coupled to the waveform rail, wherein the first inductor forms a resonant circuit with a waveform rail capacitance and returns energy to a power supply. A method of recovering energy in a print head includes providing a waveform to an array of piezoelectric actuators that are selectively electrically connectable to a waveform rail, selectively coupling at least one pseudo-jet load to the waveform rail, depending upon how many piezoelectric actuators are connected to the waveform rail, and using an inductor to form a resonant circuit with a waveform rail capacitance and to return energy to a power supply.

10 Claims, 3 Drawing Sheets

PIEZOELECTRIC PRINT HEAD DRIVE WITH ENERGY RECOVERY

TECHNICAL FIELD

This disclosure relates to piezoelectric print heads, more particularly to energy recovery in piezoelectric print heads.

BACKGROUND

Many ink jet print heads use piezoelectric (PZT) elements. The ink jets that use these elements may have a stack of plates, referred to as a jet stack, that form ink manifolds and pressure chambers, with a final plate with an array of nozzles or jets. When the PZT elements receive electrical signals, they deform membranes located adjacent to pressure chambers and cause them to eject ink.

The piezoelectric elements provide a predominantly capacitive load to the drive electronics. The energy stored in the element's capacitance is much larger than the actual energy converted to mechanical/fluid motion. Typically, excess energy dissipates as heat when the elements discharge back to the quiescent voltage level. This energy could be captured and returned to the DC power source of the drive electronics.

Circuits for driving PZT elements with energy recovery exist, but they only contemplate systems with single or a few actuators. These circuits typically require an inductor per actuator. This is impractical for a typical print head with hundreds or thousands of actuators.

SUMMARY

An embodiment is an energy recovery circuit in a print head includes at least one waveform rail, an array of piezoelectric actuators selectively electrically connectable to the waveform rail, the piezoelectric actuators creating a capacitive load, at least one pseudo-jet capacitive load, selectively coupled to the waveform rail, depending upon how many piezoelectric actuators are connected to the waveform rail, and a first inductor coupled to the waveform rail, wherein the first inductor forms a resonant circuit with a waveform rail capacitance and returns energy to a power supply.

Another embodiment is a method of recovering energy in a print head, including providing a waveform to an array of piezoelectric actuators that are selectively electrically connectable to a waveform rail, selectively coupling at least one pseudo jet load to the waveform rail, depending upon how many piezoelectric actuators are connected to the waveform rail, and using an inductor to form a resonant circuit with a waveform rail capacitance and to return energy to a power supply.

DETAILED DESCRIPTION OF THE EMBODIMENTS

Figure 1:
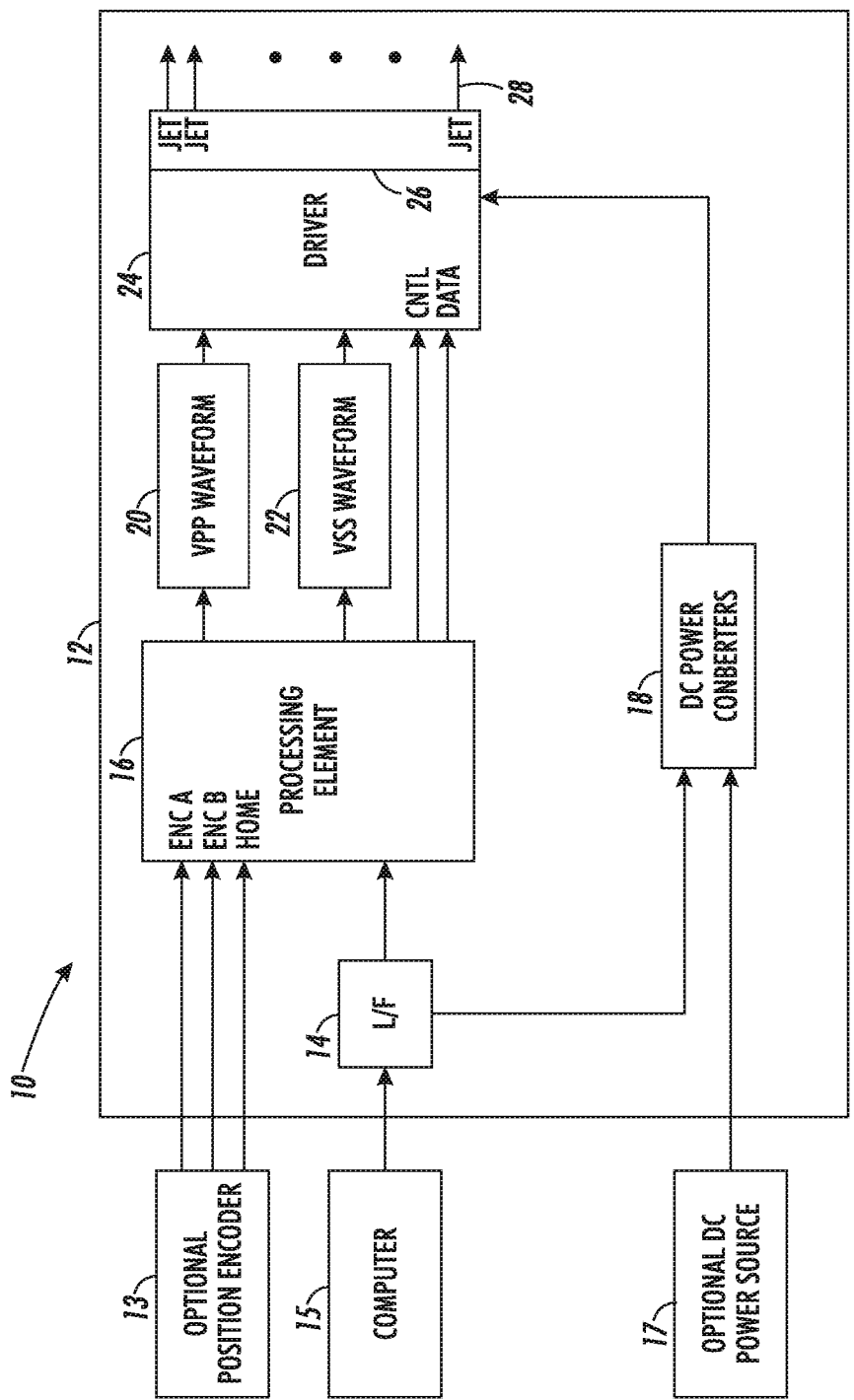
FIG. 1 show a diagram of a print head.

FIG. 1 shows an embodiment of a print system 10 having a print head 12 with all the electronics internally contained within it. These may include a processing element 16, a driver 24 that drives the jet stack 26 and its individual jets 28.

The print head 18 receives the image data through a standardized computer interface 14 such as a Universal Serial Bus (USB). For higher-frequency applications on normal USB2 connections, external DC power may be applied to the print head from power source 17.

The print head may include an internally generated 'dot clock' or firing signal. The dot clock triggers a waveform set that causes the jets such as 28 to actuate and eject ink from the jet to the print substrate. The dot clock may be generated internally or external from the print head. The internal source may be phase-locked to an external encoder. The print head architecture of FIG. 1 may be referred to as a 'standalone' print head. One should note that the term 'standalone' does not preclude the use of external components, but is standalone because they are optional.

In FIG. 1, the computer 15 has a standardized computer interface 14 to the print head 12. Any computer interface that complies with a published standard. The image data comes from the computer 15 in the form of 32-bit words, one word per jet in jet-number order, which is image-column order, over the standardized computer interface cable. The print head consumes the data as dot clocks are provided, externally or internally. The computer interface connects to the processing element 16. The processing element is any device that can buffer and process the image data to generate the waveforms necessary to cause the driver to fire the jets. In some embodiments, this may be a Field Programmable Gate Array (FPGA) or an Application Specific Integrated Circuit (ASIC), or other device capable of buffering data and generating jetting waveforms in response to a dot clock, meaning an integrated circuit that is manufactured and programmed to provide control of the print head.

The processing element 16 generates the VPP and the VSS waveforms used by the driver 24 to fire the jets such as 28. Analog circuitry 20 and 22, external to the processing element 16, finishes implementation of VPP and VSS waveform rails. This may also include DC power converters 18 connected to an external DC power source 17 or to power coming over the USB interface from the computer.

One should note that the embodiments here refer to this type of a standalone print head, but is also usable with traditional print heads having print controllers external to the print head. In the below discussion, the signals coming from the processing element 16, identified here as an FPGA without limitation to that embodiment, would instead be from the print controller external to the print head. The analog circuitry completing generation of VPP and VSS waveform rails may also be external to the print head.

Figure 2:
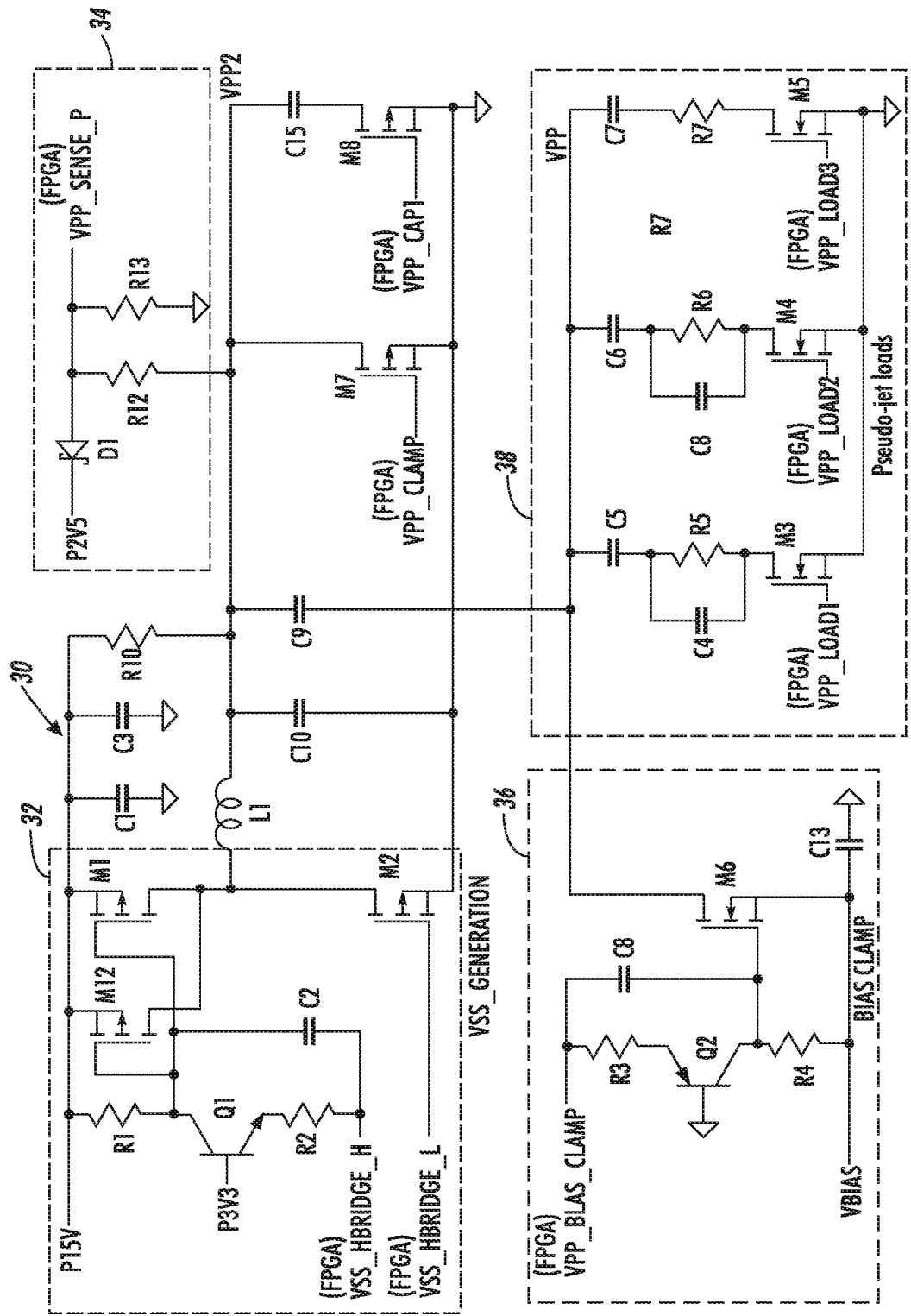
FIG. 2 shows a diagram of a circuit to return energy to a positive supply.

As mentioned previously, the actuator elements of a typical piezoelectric print head form a predominately capacitive load for the drive electronics. The energy stored in the capacitance of the elements is much larger than the actual energy converted to mechanical motion when the element actuates. This capacitive energy is conventionally dissipated as heat in the waveform generation or print head driver electronics. FIG. 2 shows an embodiment of a circuit that captures the capacitive energy and returns it to the positive supply.

In FIG. 2, the circuit 30 has several functional 'blocks' or areas. The half-bridge 32 receives signals from the processing element, VPP_HBRIDGE_H (high) and VPP_HBRIDGE_L (low). The half-bridge 32, along with its output inductor L1 and base load capacitor C10 and VPP_CLAMP M7 are used to generate the VPP2 waveform pulses. VPP2 connects to VPP through coupling capacitor C9, which allows VPP to have a DC bias. The region 36 contains a level shifter and clamp FET M6 to manage the bias on the VPP waveform rail. Region 38 contains pseudo-jet loads. Block 30 provides timing feedback to the processing element 16, in this embodiment an FPGA, for the end of each VPP pulse, signaling when VPP2 is approaching 0V, when VPP is approaching its quiescent bias voltage.

If the print head jets could run at the mechanical resonance of the piezoelectric actuator membranes, and fire only extended bursts of drops, the energy would be stored in that mechanical resonance and used over subsequent drop ejections. However, the jetting waveforms are not at this mechanical resonance frequency, nor limited to long bursts of drops, so recovery of the energy becomes a little trickier. Instead of using a mechanical resonance, a new electrical inductor/capacitor (L/C) resonance is generated. The energy in this resonance is not directly used for subsequent drops, but rather returned to the DC power supply at the end of each waveform pulse. In this implementation, there are two L/C resonant circuits, one for positive waveform pulses (VPP) and the other for negative waveform pulses (VSS). The L/C resonant frequencies are designed to match the VPP and VSS waveform pulse width(s). Other implementations may only have one waveform, either positive or negative, but not both.

For VPP in FIG. 2, the L/C resonant circuit consists of L1 and the total load capacitance after L1, referred to here as the waveform rail capacitance. The waveform rail capacitance consists of the piezoelectric elements of all firing jets, the base load C10, and C15 if it is enabled by M8, and enabled pseudo-jet loads C5, C6, and/or C7. In order to keep VPP pulse widths roughly constant, the waveform rail capacitance must remain roughly constant from one head fire to the next. To accomplish this, when all the jets are firing, none of the capacitors C5, C6, or C7, switch into the circuit. Depending upon the number of jets that are to fire, one, two or all three of these pseudo-jet loads are switched on as needed to keep the waveform rail capacitance roughly constant. If the jets 28 require a complex waveform including VPP pulses of significantly different widths, capacitor C15 is enabled during the wider VPP pulses to reduce the L/C resonant frequency.

In FIG. 2, the waveform generation depends on the inductor/capacitor resonant circuit at L1. The capacitor consists of the sum of all the capacitance on the VPP waveform rail, referred to as the waveform rail capacitance. This includes the parasitic capacitance within the PZT driver 24 from FIG. 1, capacitance intentionally added in this drive circuit at capacitor C10, and optionally, it may include C15, C5, C6 and C7. C10 is the base capacitance, included such that other sources of capacitance variations have a smaller percentage of the total. C10 requires energy to charge, almost all of which is recovered, so little net power dissipation exists. C15 adjusts the resonant frequency, to allow adjustments in pulse width for different pulses within the PZT driving waveform. Capacitors C5, C6 and C7 along with the capacitors and resistors below them, C4, R5, C11, R6 and R7, simulate the capacitance and dissipation of the PZT jet actuators. These loads switch in when FETs M3, M4, and/or M5 turn on, based upon the number of 'real' jets that do not fire on any specific waveform pulse. The number of jets translates to the number of actuators that actuate in response to signals and these will be used interchangeably here.

The generation of a VPP pulse may occur as follows. The VPP_CLAMP FET (field effect transistor) M7 and the VPP BIAS CLAMP FET M6 are initially turned on to hold VPP at its quiescent level. Depending upon the number of jets indicated by the jet data loaded into the driver 24, the load switches M3, M4, and M5 become enabled. The FETs M1 and M12 turn on and M2 turns off to ramp up current in the inductor L1.

After a short delay, typically 1-2 microseconds, the clamp FETs M7 and M6 turn off. This starts a positive ramp on VPP, the initial slope of which depends on the waveform rail capacitance and on the current in L1. Some piezoelectric print heads include jet-by-jet voltage adjustment, called normalization, implemented by disconnecting the piezoelectric elements (jets) from the waveform rails during the leading edges of waveform rail pulses, such as the rising edges of VPP pulses. Normalization is described in U.S. Pat. No. 5,502,468. For such print heads, the previously enabled load switches from M3, M4, and M5 switch off sequentially, when VPP has reached the normalization voltage for average jets. This approximates the capacitive load behavior of the real jets that are not enabled. M2 then switches on and M1 and M12 switch off to increase the slew rate of the falling edge of VPP. The timing depends on the desired falling slew rate for a specific waveform pulse, which will be 'known' by the processing element 16.

As VPP reaches its quiescent VBIAS level again, as detected by the VPP_SENSE signal and a time delay, the clamp FETs M7 and M6 turn on again. FETs M1, M12, and M2 turn off to ramp down the current left in L1. This current feeds back to the DC power supply P15V.

The P15V supply, being DC, will recover the energy when the current flows into it from L1. Most DC supplies have bypass capacitors across them, such as C1 and C3 shown in FIG. 2. The returned energy charges the bypass capacitor a little. This extra voltage then provides power for the next waveform pulse, rather than drawing as much power from the external power source. In this manner, the returned energy reduces the power consumption, and therefore the cost of operation. To minimize voltage ripple on P15V, the total bypass capacitance on P15V should be much larger than the waveform rail capacitance on VPP.

The energy flow during this process is as follows. Before the start of the VPP2 pulse, energy flows from P15V into the inductor L1. As VPP2 rises from 0V to 15V, energy flows from P15V into both the inductor L1 and the waveform rail capacitance. As mentioned before, the waveform rail capacitance consists of the jet capacitance, the pseudo-jet loads, and the base capacitance, in this case C10. As VPP2 rises from 15V to its peak, energy flows from P15V and from L1 into the waveform rail capacitance. As VPP2 falls from its peak down to 15V, energy flows from the waveform rail capacitance into P15V and into inductor L1. As VPP2 falls from 15V to 0V, energy flows from the waveform rail capacitance and from inductor L1 into P15V. After the end of the VPP2 pulse, the remaining energy in inductor L1 flows into P15V.

Figure 3:
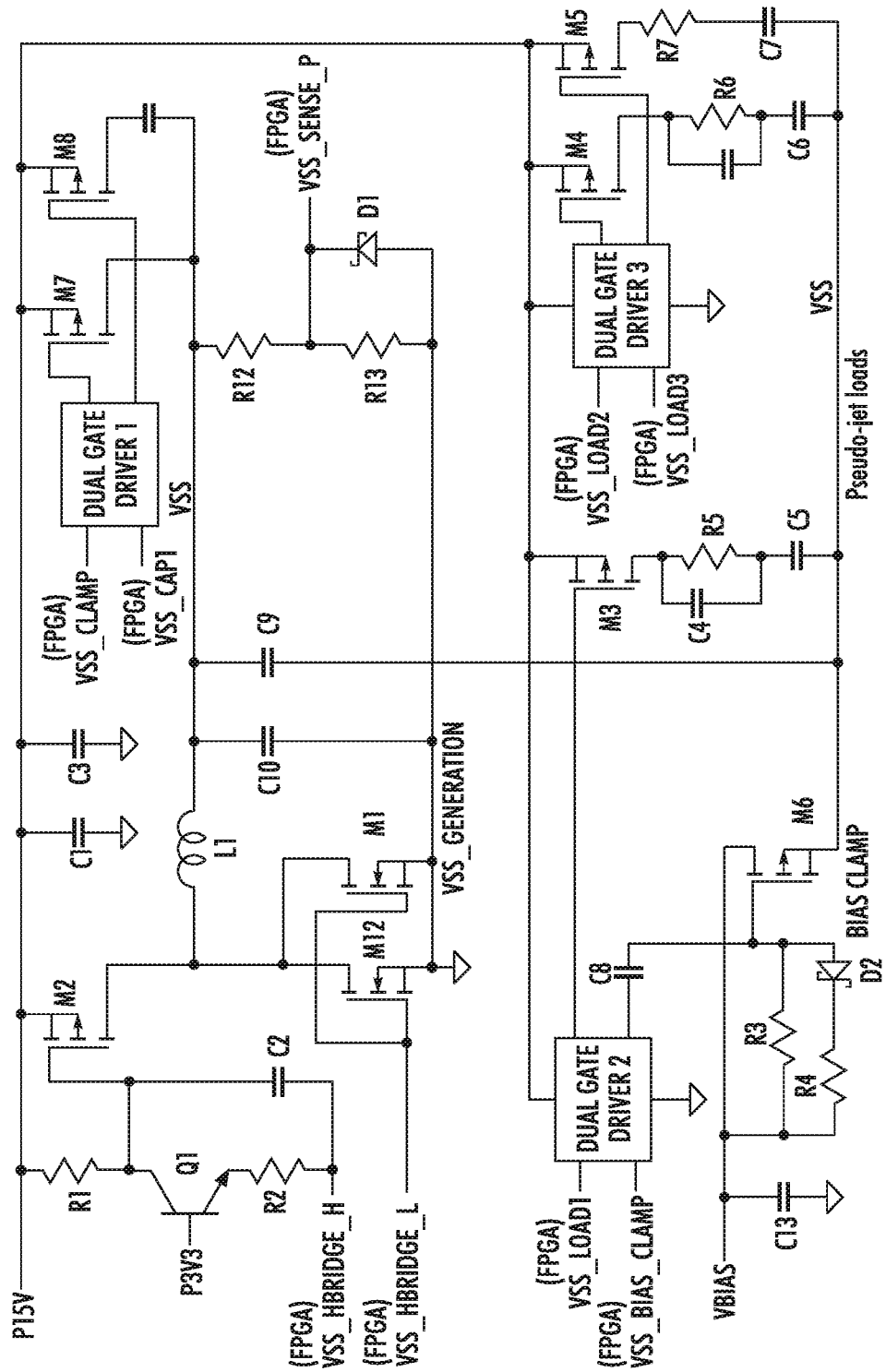
FIG. 3 shows a diagram of a circuit to return energy to a negative supply.

The above discussion focused on the positive waveform rail, VPP. FIG. 3 shows an embodiment of a circuit for the negative waveform rail, VSS. The overall circuit has the same four blocks as the VPP diagram in FIG. 2: the half-bridge, the level shifter, the pseudo jet loads, and the DC offset. Some differences exist.

In FIG. 3, R10 is not shown. In FIG. 2, R10 sets a DC level for VPP2 when all FETs are switched off for a test mode, and is optional in FIG. 2. Commercially-available, higher-voltage PFETs such as may be used at M6, M7, M8 and M3, M4, and M5, may require more than 3.3V for gate drive. Those parts cannot use the less expensive discrete level translator used with lower-voltage PFETs within the half-bridges, implemented as Ql, R1, R2 and C2 in FIGS. 2 and 3. Instead, they may employ a dual gate drive integrated circuit, such as DUAL GATE DRIVER 1, 2 and 3. The gate drivers take in 3V control signals and produce 15V gate drive signals.

Another difference between the VPP and VSS circuits occurs with the bias-clamp gate drive, M6. The VBIAS is −12V and there is no DC supply voltage available below that. PFET M6 needs a negative gate voltage relative to VBL4S to turn on. In this embodiment, a charge-pump circuit at C8, D2, R3 and R4, is used after DUAL GATE DRIVER 2. In contrast, for the VPP embodiment, M6 is an NFET needing positive gate drive at only 3.3V.

Also in VSS embodiment, D1 wires to ground rather than P2V5 because VSS_SENSE_P does not rise above 3.3V. However, it would go below ground if not clamped by D1. On the other hand, VPP_SENSE_P in FIG. 2 does not go below ground, but would go above 3.3V if not clamped.

In operation, the VSS waveform functions similar to the VPP waveform, returning excess energy from the waveform rail capacitance to the P15V supply. The pseudo-jet load capacitors M3, M4, and M4 switch in as loads depending upon the number of jets not being fired for a given waveform.

In this manner, the otherwise wasted energy stored in the capacitance of the jet actuators can be recovered across the entire array of jets. Typically, this energy dissipates as heat. In the above embodiments, the excess energy is returned to the supply for use on the next waveform.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. An energy recovery circuit in a print head, comprising:
    at least one waveform rail;
    an array of piezoelectric actuators selectively electrically connectable to the waveform rail, the piezoelectric actuators creating a capacitive load;
    at least one pseudo-jet capacitive load, selectively coupled to the waveform rail, depending upon how many piezoelectric actuators are connected to the waveform rail; and
    at least one inductor, each inductor coupled to one of the at least one waveform rail, wherein each inductor forms a resonant circuit with a waveform rail capacitance and returns energy to a power supply.

2. The energy recovery circuit in a print head of claim 1, wherein the at least one waveform rail is a positive voltage waveform rail.

3. The energy recovery circuit in a print head of claim 1, wherein the at least one waveform rail is a negative voltage waveform rail.

4. The energy recovery circuit in a print head of claim 1, wherein the at least one waveform rail comprises a positive waveform rail and a negative waveform rail, and the at least one inductor comprises two inductors, a first inductor to form a resonant circuit with positive waveform rail capacitance, and a second inductor to form a second resonant circuit with negative waveform rail capacitance.

5. The energy recovery circuit in a print head of claim 1, wherein the at least one pseudo-jet load comprises multiple pseudo-jet loads, each individually selectively coupled to the at least one waveform rail, wherein a number of pseudo-jet loads that couple depends upon a number of actuators actuated during a given waveform.

6. The energy recovery circuit in a print head of claim 1, wherein the waveform rail is generated from within the print head.

7. The energy recovery circuit in a print head of claim 1, wherein the waveform rail is generated external to the print head.

8. The energy recovery circuit of claim 1, wherein the waveform rail capacitance comprises a base capacitance, load capacitance from jets connected to the waveform rail, and any pseudo-jet loads coupled to the waveform rail.

9. A method of recovering energy in a print head, comprising:
    providing a waveform to an array of piezoelectric actuators that are selectively electrically connectable to a waveform rail;
    selectively coupling at least one pseudo-jet load to the waveform rail, depending upon how many piezoelectric actuators are connected to the waveform rail; and
    using one inductor to form a resonant circuit with a waveform rail capacitance and to return energy to a power supply.

10. The method of claim 9, further comprising normalizing the piezoelectric actuators by disconnecting the piezoelectric actuators from the waveform rail during a leading edge of waveform rail pulses.

* * * * *